United States Patent
Shimizu

(10) Patent No.: US 11,693,571 B2
(45) Date of Patent: Jul. 4, 2023

(54) MEMORY SYSTEM AND METHOD FOR CONTROLLING MEMORY SYSTEM

(71) Applicant: Kioxia Corporation, Tokyo (JP)

(72) Inventor: Akira Shimizu, Toshima Tokyo (JP)

(73) Assignee: Kioxia Corporation, Tokyo (JP)

( * ) Notice: Subject to any disclaimer, the term of this patent is extended or adjusted under 35 U.S.C. 154(b) by 15 days.

(21) Appl. No.: 17/546,465

(22) Filed: Dec. 9, 2021

(65) Prior Publication Data
US 2022/0350485 A1 Nov. 3, 2022

(30) Foreign Application Priority Data
Apr. 28, 2021 (JP) ................. 2021-076197

(51) Int. Cl.
G06F 3/06 (2006.01)

(52) U.S. Cl.
CPC ............ *G06F 3/064* (2013.01); *G06F 3/0619* (2013.01); *G06F 3/0659* (2013.01); *G06F 3/0679* (2013.01)

(58) Field of Classification Search
CPC ...... G06F 3/064; G06F 3/0619; G06F 3/0679; G06F 12/02
See application file for complete search history.

(56) References Cited

U.S. PATENT DOCUMENTS 8,924,636 B2 12/2014 Hirao et al.
2019/0369908 A1* 12/2019 Koo ..................... G06F 3/0617

FOREIGN PATENT DOCUMENTS

JP 2013-200663 A 10/2013

* cited by examiner

*Primary Examiner* — David Yi
*Assistant Examiner* — Dustin B. Fulford
(74) *Attorney, Agent, or Firm* — Allen & Overy LLP

(57) ABSTRACT

According to one embodiment, there is provided a memory system including a non-volatile memory and a controller. The non-volatile memory includes a plurality of physical blocks. The controller is connected to any of the plurality of physical blocks via a plurality of channels. The controller is configured to construct a plurality of logical blocks and, read or write data from or into any of the plurality of logical blocks constructed. The logical blocks are management units in which any of the physical blocks is grouped across the plurality of channels. The controller is configured to construct the plurality of logical blocks so that a first number of defective blocks and a second number of pseudo defective blocks for shortfall defective blocks with respect to a target number of defective blocks are distributed into the plurality of logical blocks.

20 Claims, 17 Drawing Sheets

| NUMBER OF INITIALLY DEFECTIVE BLOCKS | MEMORY SYSTEM 100A | MEMORY SYSTEM 100B | MEMORY SYSTEM 100C | MEMORY SYSTEM 100D |
|---|---|---|---|---|
| | 12 | 20 | 10 | 16 |

| TARGET NUMBER OF DEFECTIVE BLOCKS | MEMORY SYSTEM 100A | MEMORY SYSTEM 100B | MEMORY SYSTEM 100C | MEMORY SYSTEM 100D |
|---|---|---|---|---|
| | 21 | 21 | 21 | 21 |

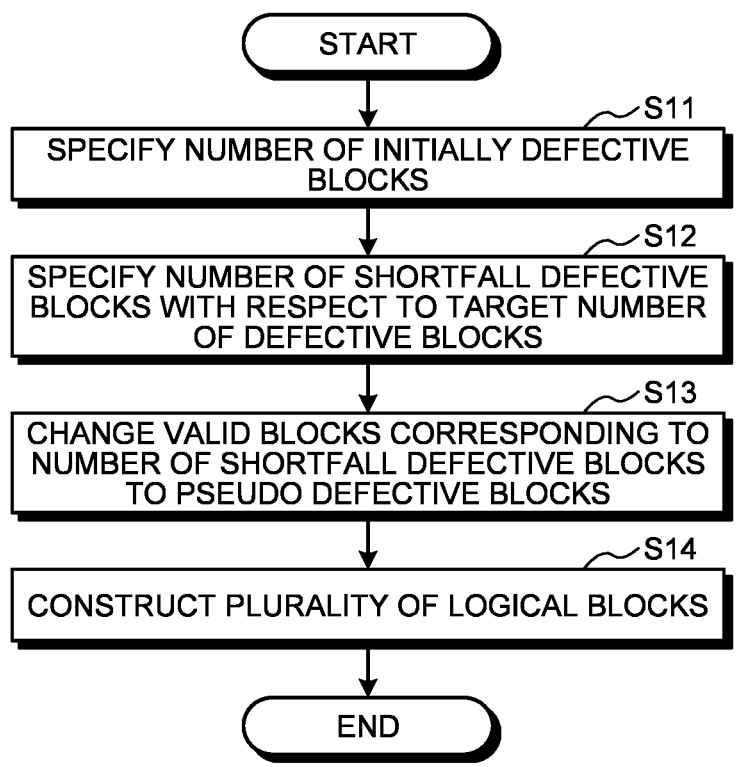

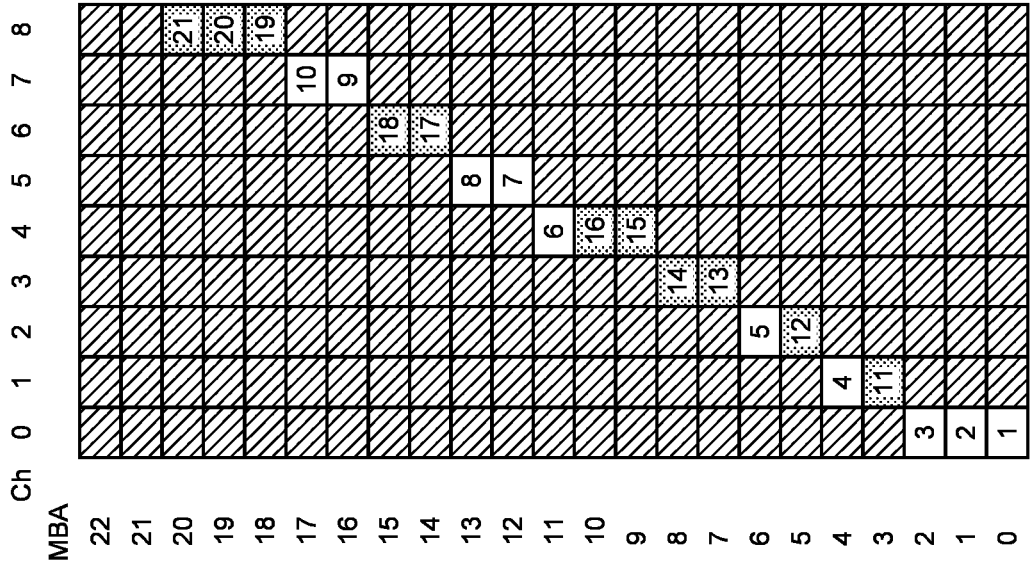
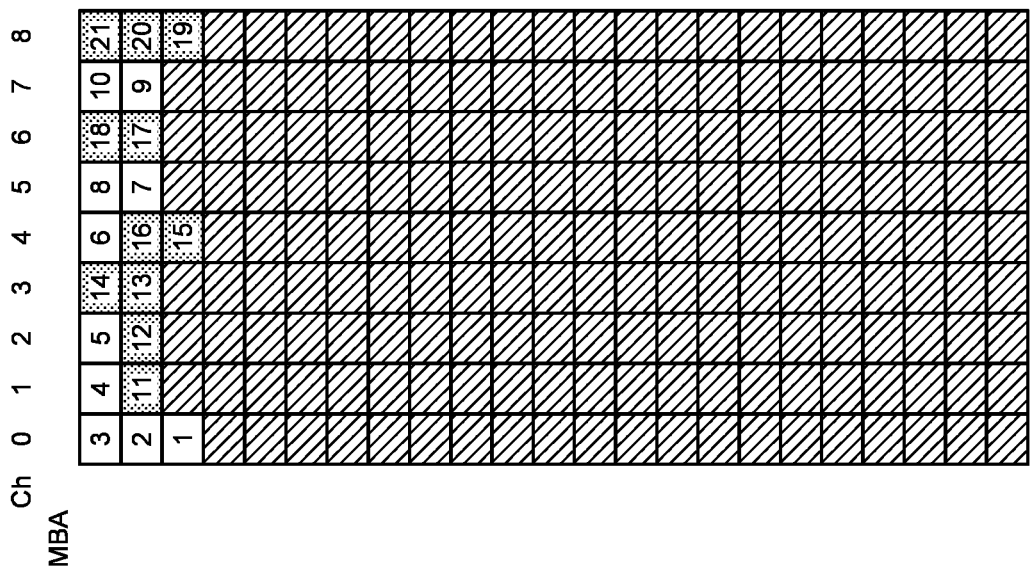
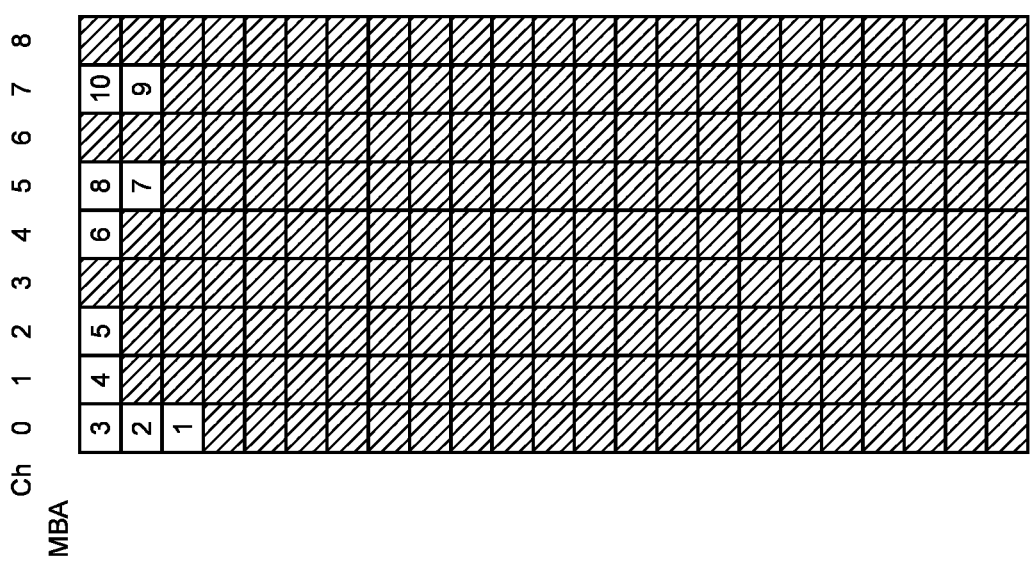

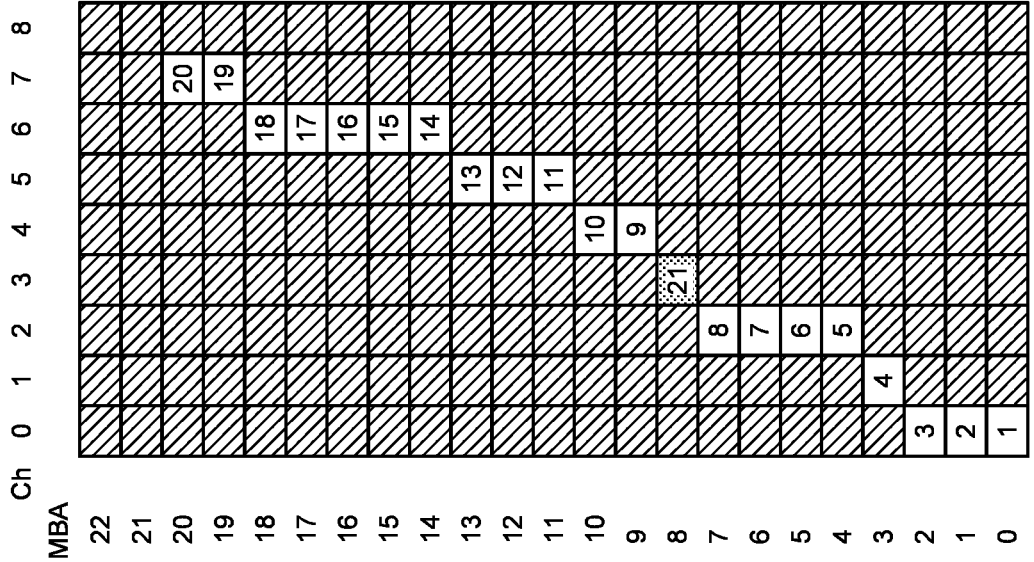
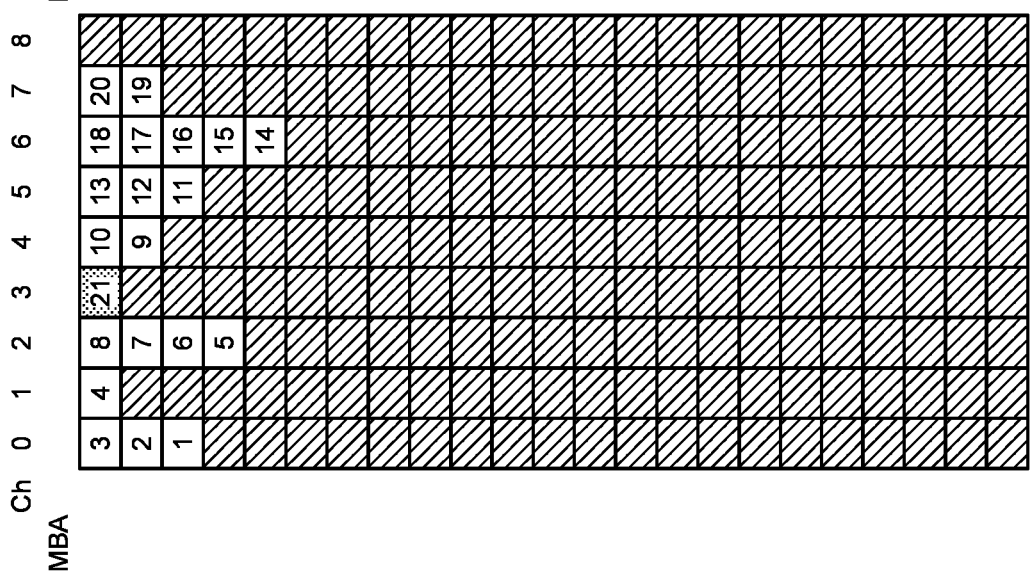
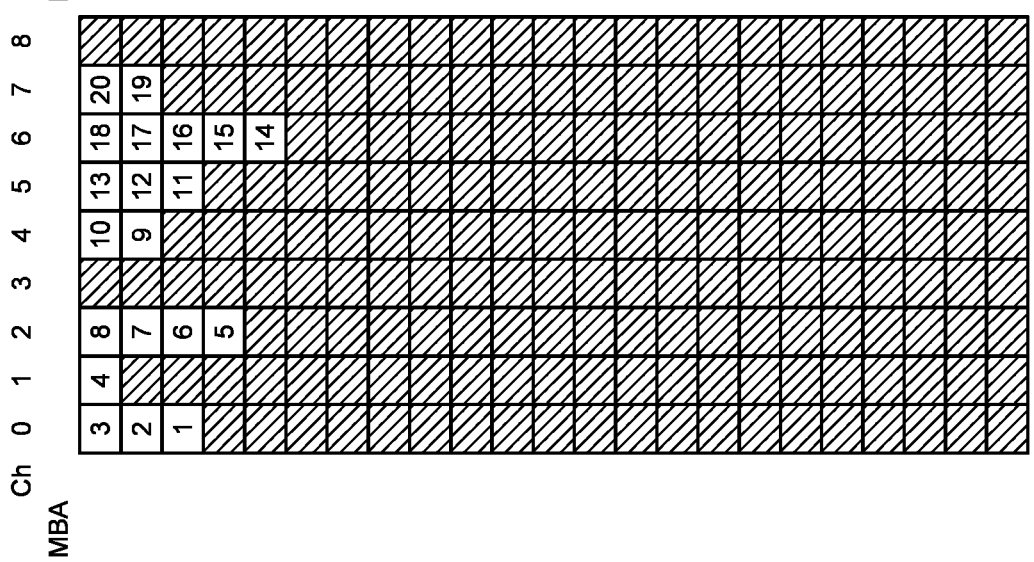

| NUMBER OF INITIALLY DEFECTIVE BLOCKS | MEMORY SYSTEM 100A | MEMORY SYSTEM 100B | MEMORY SYSTEM 100C | MEMORY SYSTEM 100D |
|---|---|---|---|---|
| | 12 | 20 | 10 | 16 |

| TARGET NUMBER OF DEFECTIVE BLOCKS | MEMORY SYSTEM 100A | MEMORY SYSTEM 100B | MEMORY SYSTEM 100C | MEMORY SYSTEM 100D |
|---|---|---|---|---|
| | 21~29 | 21~29 | 21~29 | 21~29 |

| NUMBER OF INITIALLY DEFECTIVE BLOCKS | MEMORY SYSTEM 100A | MEMORY SYSTEM 100B | MEMORY SYSTEM 100C | MEMORY SYSTEM 100D |
|---|---|---|---|---|
| | 12 | 20 | 10 | 16 |

| TARGET NUMBER OF DEFECTIVE BLOCKS | MEMORY SYSTEM 100A | MEMORY SYSTEM 100B | MEMORY SYSTEM 100C | MEMORY SYSTEM 100D |
|---|---|---|---|---|
| | 29 | 29 | 29 | 29 |

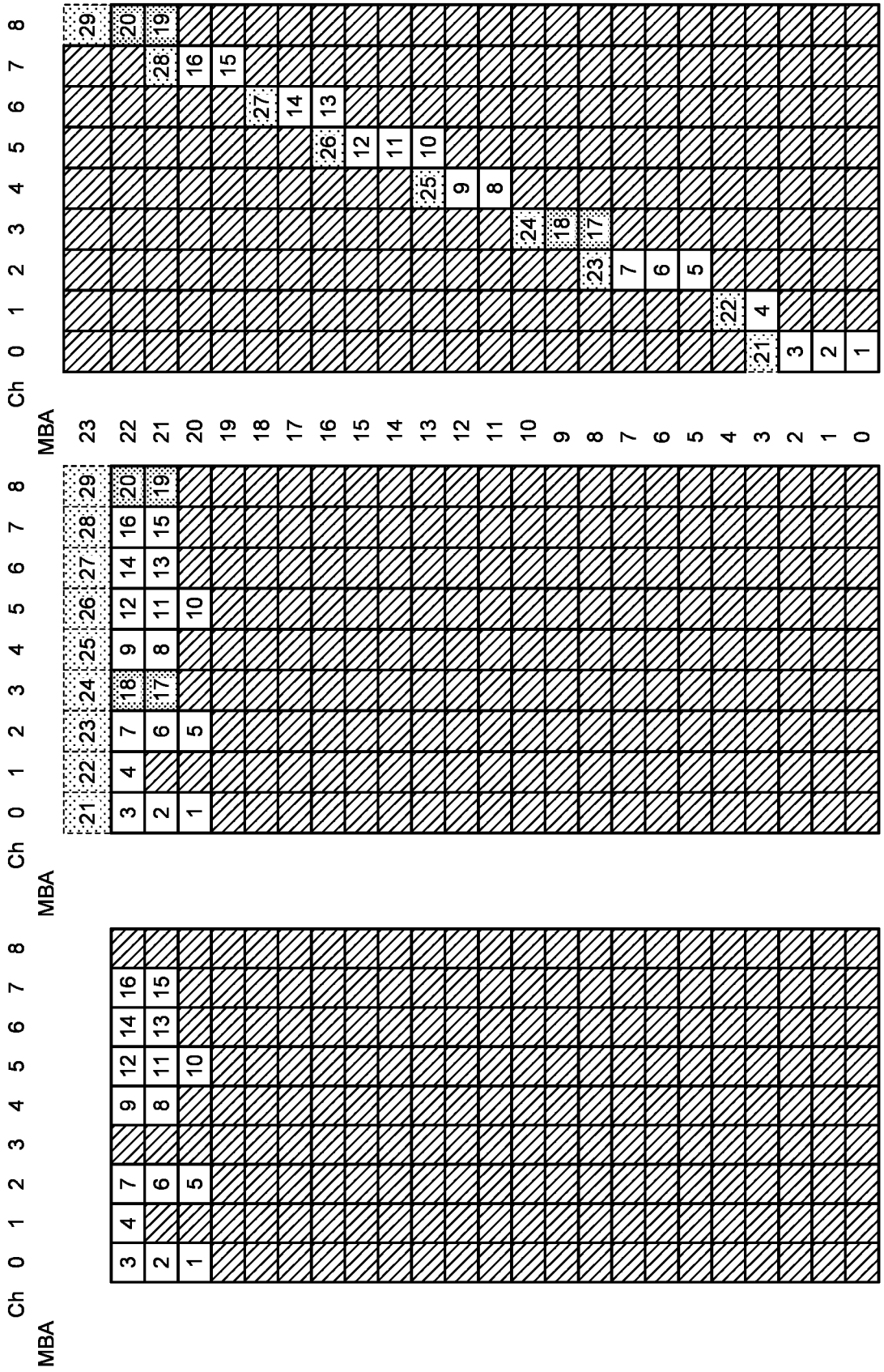

MEMORY SYSTEM AND METHOD FOR CONTROLLING MEMORY SYSTEM

CROSS-REFERENCE TO RELATED APPLICATIONS

This application is based upon and claims the benefit of priority from Japanese Patent Application No. 2021-076197, filed on Apr. 28, 2021; the entire contents of which are incorporated herein by reference.

FIELD

Embodiments described herein relate generally to a memory system and a method for controlling the memory system.

BACKGROUND

There are memory systems each provided with a non-volatile memory including a plurality of physical blocks. In the memory systems, a plurality of logical blocks is constructed. The logical block is a management unit in which some of the plurality of physical blocks included in the non-volatile memory are grouped. In this case, it is desirable to appropriately construct each logical block.

BRIEF DESCRIPTION OF THE DRAWINGS

FIG. 5 is a flowchart illustrating processing for constructing logical blocks in the embodiment;

FIGS. 6A to 6C are diagrams illustrating an example of the processing for constructing logical blocks in the embodiment;

FIGS. 7A to 7C are diagrams illustrating another example of the processing for constructing logical blocks in the embodiment;

FIGS. 10A to 10O are diagrams illustrating an example of the processing for constructing logical blocks in the first modification of the embodiment;

FIGS. 15A to 15C are diagrams illustrating another example of the processing for constructing logical blocks in the second modification of the embodiment;

DETAILED DESCRIPTION

Figure 1:
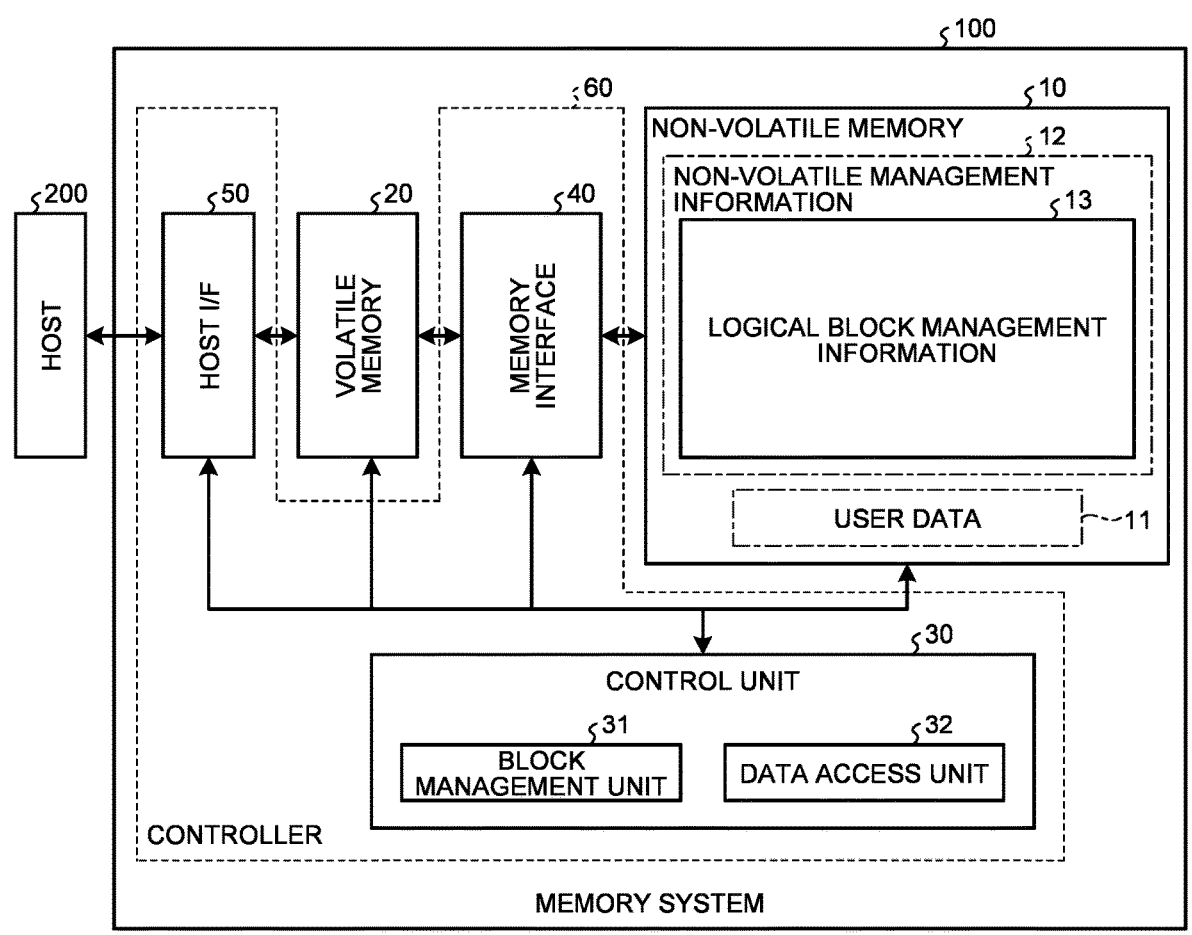
FIG. 1 is a diagram illustrating a configuration of a memory system according to one embodiment.

In general, according to one embodiment, there is provided a memory system including a non-volatile memory and a controller. The non-volatile memory includes a plurality of physical blocks. The controller is connected to any of the plurality of physical blocks via a plurality of channels. The controller is configured to construct a plurality of logical blocks, and to read or write data from or to any of the plurality of logical blocks constructed. The logical blocks are management units in which any of the physical blocks is grouped across the plurality of channels. The controller is configured to construct the plurality of logical blocks so that a first number of defective blocks and a second number of pseudo defective blocks for shortfall defective blocks with respect to a target number of defective blocks are distributed into the plurality of logical blocks.

Exemplary embodiments of a memory system will be explained below in detail with reference to the accompanying drawings. The present invention is not limited to the following embodiments.

Embodiment

A memory system according to one embodiment includes a non-volatile memory. The memory system writes data to the non-volatile memory, reads data stored in the non-volatile memory, or erases data stored in the non-volatile memory. The non-volatile memory includes a plurality of physical blocks, which are the smallest units of erasure.

When manufacturing the memory system, a plurality of logical blocks is constructed by grouping the plurality of physical blocks included in the non-volatile memory into logical groups. In this case, physical blocks containing defects at the time of manufacturing (initially defective blocks) may be included in the logical blocks. As the number of defective blocks included in the logical blocks increases, an amount of data that can be written into the logical blocks decreases, which may cause a decrease in random write performance. When manufacturing a plurality of memory systems, if the plurality of memory systems are different from each other in the total number of defective blocks thereof, the memory systems may be different from each other in random write performance as well.

Therefore, in the present embodiment, the memory system constructs a plurality of logical blocks by using a first number of defective blocks and a second number of pseudo defective blocks for shortfall defective blocks with respect to the target number of defective blocks. In this way, differences in random write performance can be reduced.

Specifically, the target number of defective blocks to be shared in common by the plurality of memory systems is determined in advance based on the respective numbers of initially defective blocks in the plurality of memory systems, and the determined target number of defective blocks is set for each of the plurality of memory systems. The memory system, which includes a non-volatile memory, and specifies a first number of defective blocks among a plurality of physical blocks included in the non-volatile memory. The memory system specifies a second number of shortfall defective blocks with respect to a target number of defective blocks depending on the first number. The memory system prepares second number of pseudo defective blocks. For example, the memory system changes valid blocks of the second number among the plurality of physical blocks to pseudo defective blocks, respectively. The memory system constructs a plurality of logical blocks while distributing the first number of defective blocks and the second number of pseudo defective blocks into the plurality of logical blocks. In this way, the logical blocks constructed so that the total number of defective blocks in each of the plurality of memory systems becomes the common target number of defective blocks make it possible to randomly write data to the non-volatile memory. As a result, differences in random write performance between the memory systems can be reduced.

More specifically, a memory system 100 can be configured as illustrated in FIG. 1. FIG. 1 is a diagram illustrating a configuration of the memory system 100.

The memory system 100 is, for example, a solid state drive (SSD). The memory system 100 can be connected to a host 200 via a host interface (host I/F) 50. The memory system 100 functions as an external storage device of the host 200 connected thereto. The host 200 is, for example, a CPU of a personal computer or a CPU of an imaging device such as a still camera or a video camera. The memory system 100 includes a non-volatile memory 10, a volatile memory 20, and a controller 60. The controller 60 includes a control unit 30, a memory interface 40, and a host interface 50. The non-volatile memory 10 is a semiconductor memory that can store data in a non-volatile manner, such as a NAND flash memory. The volatile memory 20 is a semiconductor memory that can be accessed at a higher speed than the non-volatile memory 10. The controller 60 is configured as, for example, a system on chip (SoC).

The non-volatile memory 10 stores user data 11 specified by the host 200, and stores information regarding the operation of the volatile memory 20 as non-volatile management information 12. The non-volatile memory 10 has a memory cell array in which a plurality of memory cells is arranged in a matrix form, and each memory cell can store multiple values using a plurality of physical pages. The non-volatile memory 10 includes a plurality of memory chips, and each memory chip includes a plurality of physical blocks which are units of data erasure. Further, data is written to or read out of the non-volatile memory 10 for each physical page. The physical block includes a plurality of physical pages.

Figure 2:
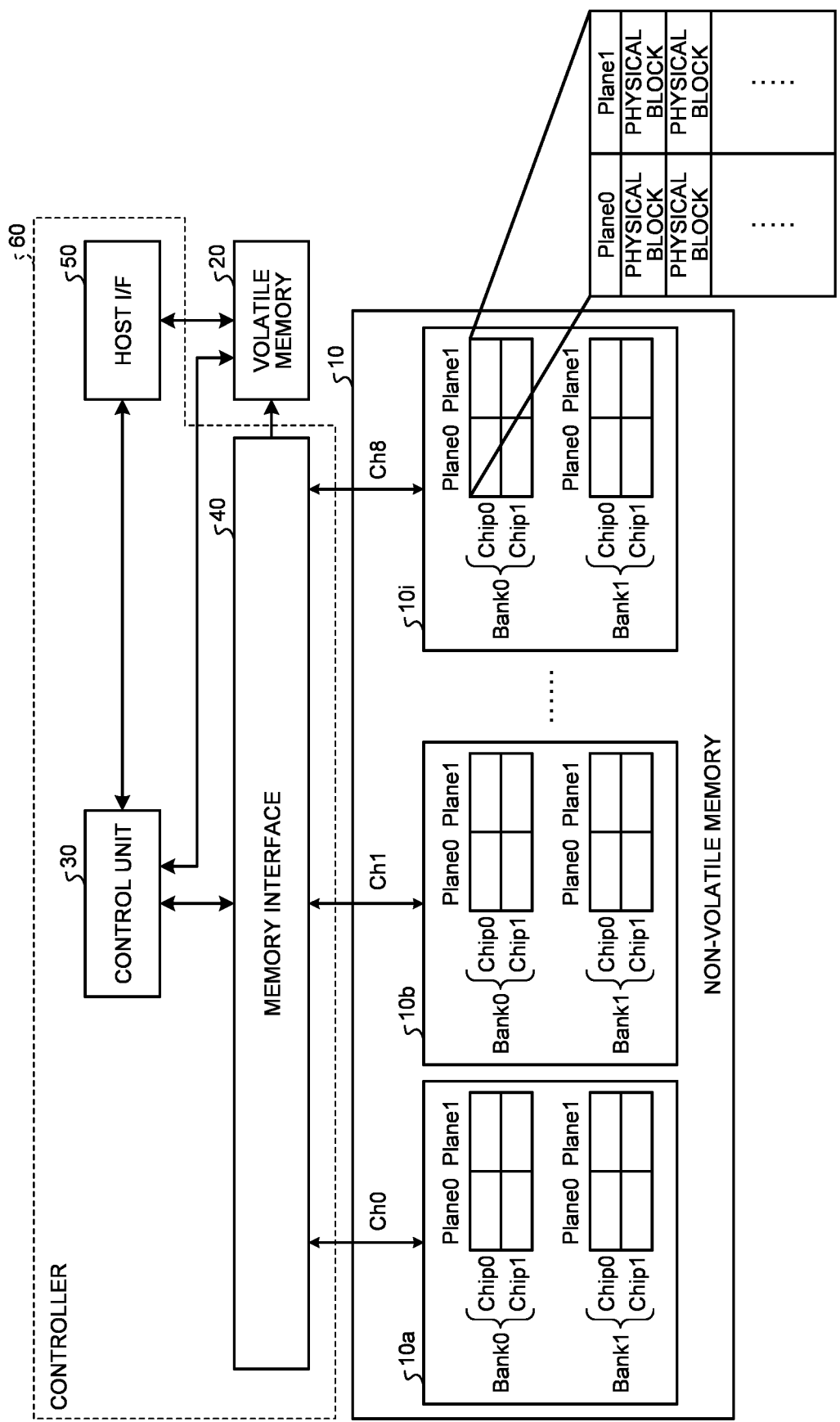
FIG. 2 is a diagram illustrating a configuration of a non-volatile memory in the embodiment.

FIG. 2 illustrates a specific configuration example of the non-volatile memory 10. In this embodiment, the non-volatile memory 10 is connected in parallel to the memory interface 40 of the controller 60 via nine channels Ch0 to Ch8. That is, nine parallel operation elements 10a to 10i can be operated in parallel. The number of channels is not limited to nine, and any number of channels can be adopted. Each of the parallel operation elements 10a to 10i includes a plurality of banks (in this case, two banks Bank0 and Bank1) capable of bank interleaving. In each of the parallel operation elements 10a to 10i, each bank includes a plurality of memory chips (in this case, two memory chip Chip0 and Chip1). Each memory chip is divided into, for example, two districts, plane 0 and plane 1, each including a plurality of physical blocks. Plane 0 and plane 1 have independent peripheral circuits (e.g., row decoders, column decoders, page buffers, and data caches) to use a plane double speed mode, such that data can be erased, written, or read in parallel.

In the non-volatile memory 10, a parallel operation based on the plurality of channels, a parallel operation based on the plurality of banks, and a parallel operation in the double speed mode using the plurality of planes can be performed. When the number of channels is nine, the number of banks is two, and the number of planes is two, 36 physical blocks can be operated in parallel. That is, the controller 60 can be connected to the plurality of physical blocks via the plurality of channels to operate the plurality of physical blocks in parallel.

The volatile memory 20 includes a storage area as a write buffer temporarily storing data from the host 200 when writing the data to the non-volatile memory 10, a storage area for storing or updating management information such as the non-volatile management information 12, and a work area for temporarily storing data read from the non-volatile memory 10, etc.

When outputting a read request or a write request to the memory system 100, the host 200 inputs a logical block address (LBA) as a logical address to the memory system 100 via the host interface 50. The LBA is a logical address in which a serial number starting from 0 is given for a sector (size: e.g., 512B).

In the memory system 100, the controller 60 constructs a virtual block called a logical block as a unit for collectively managing a plurality of physical blocks. In this embodiment, the logical block is a combination of physical blocks enabling channel parallel, bank interleaving, and plane double-speed operation. That is, the logical block includes physical blocks corresponding to the number of channels× the number of banks×the number of planes. In the case of FIG. 2, the number of channels is nine, the number of planes is two, and the number of banks is two. Thus, the logical block can include a maximum of 36 physical blocks.

It should be noted that, when constructing the logical block, a media block address (MBA) is used as a logical address. The MBA is a logical address specified by the memory system 100 and is distinguished from the LBA, which is a logical address specified by the host. The logical block may include physical blocks for a plurality of channels, may include physical blocks for a plurality of banks, or may include physical blocks for a plurality of planes. In addition, physical blocks may be combined to perform channel parallel and bank interleaving, physical blocks may be combined to perform channel parallel and plane double-speed operation, and physical blocks may be combined to perform bank interleaving and plane double-speed operation. For simplification, a configuration in which the number of channels is nine, the number of planes is one, and the number of banks is one will be exemplified below, and the illustration and description of the plane and bank will be omitted.

The non-volatile management information 12 illustrated in FIG. 1 refers to non-volatile information among management information used inside the memory system 100. When the controller 60 generates or updates management information, the management information is stored into the non-volatile memory 10 in a non-volatile manner. The non-volatile management information 12 includes a logical-physical conversion table (not illustrated), logical block management information 13, and the like. The logical-physical conversion table is information for managing a correspondence between an LBA, which is a logical address specified by the host 200, and a physical address, which indicates a data storage position in the non-volatile memory 10. The logical block management information 13 is information for managing a plurality of logical blocks constructed in the memory system 100.

The memory interface 40 performs processing for interfacing with the non-volatile memory 10. Based on a control of the control unit 30, the memory interface 40 writes data temporarily stored in the volatile memory 20 to the non-volatile memory 10, or reads out data stored in the non-volatile memory 10 and transfer the read-out data to the volatile memory 20.

The function of the control unit 30 is realized by a system program (firmware) stored in the non-volatile memory 10 and a processor executing the firmware. The control unit 30 includes a data access unit 32 and a block management unit 31. The data access unit 32 performs processing for writing data to the non-volatile memory 10 via the write buffer of the volatile memory 20, processing for reading data from the non-volatile memory 10, and data organization (e.g., garbage collection, compaction, and refreshment) in the non-volatile memory 10, etc. The garbage collection and compaction are processing for generating a new free block (a logical block containing no valid data) by collecting valid data in a logical block and rewriting the collected valid data into another logical block.

Figure 3:
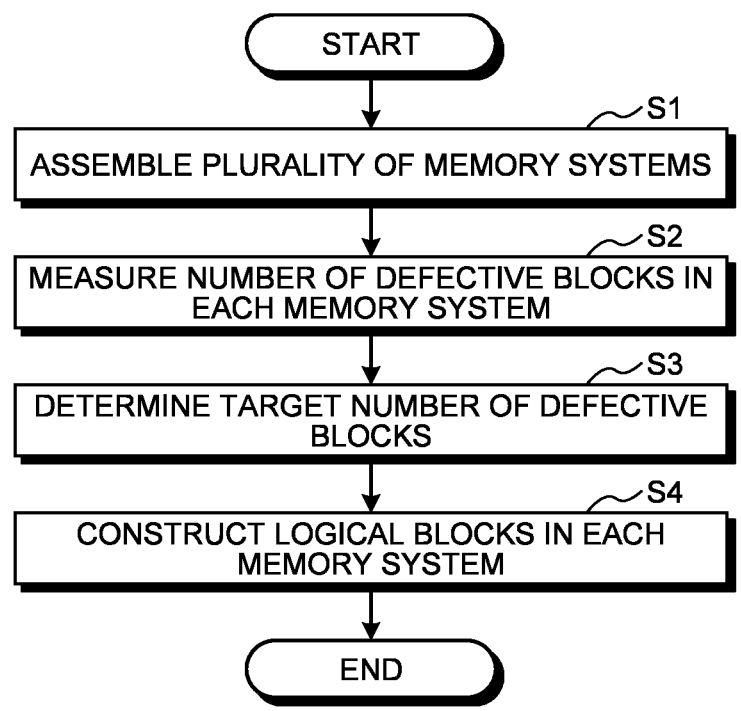
FIG. 3 is a flowchart illustrating a process of manufacturing the memory system according to the embodiment.

The block management unit 31 performs logical block construction processing when power is turned on for the first time in a memory system manufacturing stage, and registers a construction result to the logical block management information 13. The memory system 100 is manufactured together with other memory systems in a flow illustrated in FIG. 3. FIG. 3 is a flowchart illustrating a process of manufacturing the memory system 100.

The plurality of memory chips included in the non-volatile memory 10 are manufactured as a plurality of first memory chips. A certain number of first memory chips among the plurality of first memory chips are resin-sealed in a first memory package. The volatile memory 20 includes one or more second memory chips. The one or more second memory chips are resin-sealed in one or more second memory packages. The controller 60 includes a controller chip. The controller chip is resin-sealed in a controller package. The plurality of first memory packages, the one or more second memory packages, and the controller package are mounted on a printed wiring board. The printed wiring board is fitted into a housing. The plurality of first memory chips, the one or more second memory chips, and the controller chip may each be resin-sealed in one package. Then, this one package may be mounted on a printed wiring board. In this way, a plurality of memory systems 100 are assembled together (S1). For example, four memory systems 100 assembled together will be referred to as memory system 100A, memory system 100B, memory system 100C, and memory system 100D, respectively.

In the non-volatile memory 10 of each of the memory systems 100A to 100D, the plurality of physical blocks includes physical blocks having defects and physical blocks having no defects. Hereinafter, the physical blocks having defects may be referred to as defective blocks, and the physical blocks having no defects may be referred to as valid blocks. In addition, physical blocks having defects in the manufacturing stage will be referred to as initially defective blocks, and physical blocks having no defects in the manufacturing stage but having defects during use after shipment will be referred to as late defective blocks to be distinguished from each other. Whether or not a physical block has a defect can be determined based on whether or not a bit error rate exceeds a threshold by writing data into the physical block and measuring a bit rate at which the data read from the physical block becomes uncorrectable when erroneously corrected.

Figures 4A, 4B:
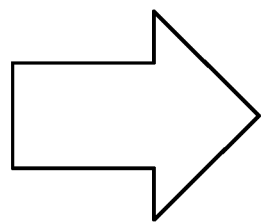
FIGS. 4A and 4B are diagrams illustrating processing for determining a target number of defective blocks in the embodiment.

A test device supplies a test pattern to each of the memory systems 100A to 100D, and measures the number of defective blocks in each of the memory systems 100A to 100D based on a response from each of the memory systems 100A to 100D (S2). The controller 60 in each of the memory systems 100A to 100D may determine a physical block whose bit error rate exceeds a threshold as a defective block with respect to each physical block using the test pattern. Each of the memory systems 100A to 100D counts the number of defective blocks determined, and uses information on the count number as the information on the number of initially defective blocks. The controller 60 in each of the memory systems 100A to 100D stores the information on the number of initially defective blocks as the non-volatile management information 12 into the non-volatile memory 10, and returns the information on the number of initially defective blocks to the test device as a response. In this way, for example, as illustrated in FIG. 4A, the numbers of initially defective blocks in the memory system 100A, the memory system 100B, the memory system 100C, and the memory system 100D can be measured as 12, 20, 10, and 16, respectively.

Thereafter, as illustrated in FIG. 3, the test device determines a target number of defective blocks common to the plurality of memory systems 100A to 100D according to the numbers of initially defective blocks in the plurality of memory systems 100A to 100D (S3). The test device may determine the target number of defective blocks by adding the number of margins (e.g., one) to the largest one among the numbers of initially defective blocks in the plurality of memory systems 100A to 100D. For example, in the case of FIG. 4A, among the numbers of initially defective blocks in the plurality of memory systems 100A to 100D, i.e., 12, 20, 10, and 16, the largest number is 20. Thus, as illustrated in FIG. 4B, 20+1=21 is determined as the target number of defective blocks for each of the memory systems 100A to 100D. The test device supplies information on the target number of defective blocks to each of the memory systems 100A to 100D, and sets the information on the target number of defective blocks to each of the memory systems 100A to 100D. The information on the target number of defective blocks includes a target number of defective blocks for all of the memory systems. The controller 60 in each of the memory systems 100A to 100D may store the information on the target number of defective blocks as the non-volatile management information 12 into the non-volatile memory 10.

A logical block is constructed in each of the memory systems 100A to 100D (S4). In each of the memory systems 100A to 100D, the controller 60 constructs a plurality of logical blocks from the plurality of physical blocks. Each logical block is constructed to include a plurality of physical blocks grouped across the plurality of channels Ch0 to Ch8.

Specifically, the controller 60 constructs the logical blocks in a flow illustrated in FIG. 5. FIG. 5 is a flowchart illustrating processing for constructing logical blocks.

The controller 60 in each of the memory systems 100A to 100D specifies the number of initially defective blocks with reference to the information on the number of initially defective blocks stored as the non-volatile management information 12 in the non-volatile memory 10 (S11). In the case illustrated in FIG. 4A, the controllers 60 of the memory systems 100A, 100B, 100C, and 100D specify 12, 20, 10, and 16 as the numbers of initially defective blocks, respectively.

For example, the controller 60 of the memory system 100C specifies that the number of initially defective blocks is 10, as illustrated in FIG. 6A. The controller 60 of the memory system 100C may specify the number of initially defective blocks for each channel from physical position information included in the information on the number of initially defective blocks. In the case of FIG. 6A, the numbers of initially defective blocks corresponding to the channels Ch0, Ch1, Ch2, Ch3, Ch4, Ch5, Ch6, Ch7, and Ch8 are specified as three, one, one, zero, one, two, zero, two, and zero, respectively.

The controller 60 of the memory system 100C may manage the initially defective blocks separately by channel. In the case of FIG. 6A, the controller 60 performs management such that initially defective block nos. 1 to 3 correspond to the channel Ch0, initially defective block no. 4 corresponds to the channel Ch1, initially defective block no. 5 corresponds to the channel Ch2, initially defective block no. 6 corresponds to the channel Ch4, initially defective block nos. 7 and 8 correspond to the channel Ch5, and initially defective block nos. 9 and 10 correspond to the channel Ch7. At this time, a logical block address MBA for each physical block is not decided.

Alternatively, the controller 60 of the memory system 100B specifies that the number of initially defective blocks is 20, as illustrated in FIG. 7A. The controller 60 of the memory system 100B may specify the number of initially defective blocks for each channel from physical position information included in the information on the number of initially defective blocks. In the case of FIG. 7A, the numbers of initially defective blocks corresponding to the channels Ch0, Ch1, Ch2, Ch3, Ch4, Ch5, Ch6, Ch7, and Ch8 are specified as three, one, four, zero, two, three, five, two, and zero, respectively. The controller 60 of the memory system 100B may manage the initially defective blocks separately by channel. In the case of FIG. 7A, the controller 60 performs management such that initially defective block nos. 1 to 3 correspond to the channel Ch0, initially defective block no. 4 corresponds to the channel Ch1, initially defective block no. 5 to 8 correspond to the channel Ch2, initially defective block no. 9 and 10 correspond to the channel Ch4, initially defective block nos. 11 to 13 correspond to the channel Ch5, initially defective block nos. 14 to 18 correspond to the channel Ch6, and initially defective block nos. 19 and 20 correspond to the channel Ch7. At this time, a logical block address MBA for each physical block is not decided.

In addition, the controller 60 in each of the memory systems 100A to 100D specifies a target number of defective blocks with reference to the information on the target number of defective blocks stored as the non-volatile management information 12 in the non-volatile memory 10. In the case of FIG. 4B, the controller 60 in each of the memory systems 100A to 100D specifies 21 as a common target number of defective blocks.

As illustrated in FIG. 5, the controller 60 specifies the number of shortfall defective blocks with respect to the target number of defective blocks depending on the number of initially defective blocks specified in S11 (S12). In the case of FIGS. 4A and 4B, the controllers 60 of the memory systems 100A, 100B, 100C, and 100D specify 21−12=9, 21−20=1, 21−10=11, and 21−16=5 as the respective numbers of shortfall defective blocks with respect to the target number of defective blocks.

The controller 60 in each of the memory systems 100A to 100D prepares pseudo defective blocks corresponding to the number of shortfall defective blocks specified in S12. The controller 60 in each of the memory systems 100A to 100D may prepare pseudo defective blocks corresponding to the number of shortfall defective blocks by respectively changing valid blocks corresponding to the number of shortfall defective blocks to the pseudo defective blocks (S13). The controller 60 may preferentially change, to a pseudo defective block, a valid block corresponding to a channel Ch having a smaller number of initially defective blocks than the others among the plurality of channels Ch0 to Ch8.

For example, the controller 60 of the memory system 100C changes 11 valid blocks, which correspond to the number of shortfall defective blocks with respect to the target number of defective blocks, to pseudo defective blocks, as illustrated in FIG. 6A. The controller 60 preferentially changes valid blocks corresponding to the channels Ch3, Ch6, and Ch8, each having no initially defective block, to pseudo defective blocks. In the case of FIG. 6B, the controller 60 changes two, two, and three valid blocks each corresponding to the channels Ch3, Ch6, and Ch8, to two, two, and three pseudo defective blocks, respectively. In addition, the controller 60 changes one, one, and two valid blocks each corresponding to the channels Ch1, Ch2, and Ch4, to one, one, and two pseudo defective blocks, respectively. In this way, a total number of defective blocks in the memory system 100C becomes 10+11=21, which is equal to the target number of defective blocks.

The controller 60 of the memory system 100C may manage the pseudo defective blocks separately by channel. In the case of FIG. 6B, the controller 60 performs management such that pseudo defective block no. 11 corresponds to the channel Ch1, pseudo defective block no. 12 corresponds to the channel Ch2, pseudo defective block nos. 13 and 14 correspond to the channel Ch3, pseudo defective block nos. 15 and 16 correspond to the channel Ch4, pseudo defective block nos. 17 and 18 correspond to the channel Ch6, and pseudo defective block nos. 19 to 21 correspond to the channel Ch9. At this time, a logical block address MBA for each physical block is not decided.

Alternatively, the controller 60 of the memory system 100B changes one valid block which corresponds to the number of shortfall defective blocks with respect to the target number of defective blocks, to a pseudo defective block, as illustrated in FIG. 7A. The controller 60 can change valid blocks corresponding to the channels Ch3 and Ch8, each having no initially defective block, to pseudo defective blocks. In the case of FIG. 7B, the controller 60 changes one valid block corresponding to the channel Ch3, to one pseudo defective block. In this way, a total number of defective blocks in the memory system 100C becomes 20+1=21, which is equal to the target number of defective blocks.

The controller 60 of the memory system 100B may manage the pseudo defective blocks separately by channel. In the case of FIG. 7B, the controller 60 performs management such that pseudo defective block no. 21 corresponds to the channel Ch3. At this time, a logical block address MBA for each physical block is not decided.

As illustrated in FIG. 5, the controller 60 in each of the memory systems 100A to 100D constructs a plurality of logical blocks with respect to a plurality of physical blocks by using the initially defective blocks in the number specified in S11 and the pseudo defective blocks prepared in S13 (S14). The controller 60 constructs a plurality of logical blocks in such a manner that the initially defective blocks in the number specified in S11 and the pseudo defective blocks prepared in S13 are distributed into the plurality of logical blocks, and are distributed into the plurality of channels Ch0 to Ch8. The controller 60 assigns logical block addresses MBAs to the plurality of physical blocks constructed, and generates logical block management information 13 for managing the plurality of logical blocks constructed.

For example, the controller 60 of the memory system 100C constructs a plurality of logical blocks with respect to a plurality of physical blocks using 10 initially defective blocks and 11 pseudo defective blocks as illustrated in FIG. 6C. The controller 60 generates the logical block management information 13 for managing the plurality of logical blocks by assigning logical block addresses MBAs "0" to "22" to a plurality of physical blocks, in such a manner that the 10 initially defective blocks and the 11 pseudo defective blocks are distributed into the plurality of logical blocks, and are distributed into the plurality of channels Ch0 to Ch8.

The controller 60 processes logical blocks of MBAs "0" to "2" to include the initially defective block nos. 1 to 3, respectively, as physical blocks corresponding to the channel Ch0. The controller 60 processes a logical block of MBA "3" to include the pseudo defective block no. 11 as a physical block corresponding to the channel Ch1. The controller 60 processes a logical block of MBA "4" to include the initially defective block no. 4 as a physical block corresponding to the channel Ch1. The controller 60 processes logical blocks of MBAs "5" to "15" in the same manner. In addition, the controller 60 processes logical blocks of MBAs "16" and "17" to include the initially defective block nos. 9 and 10, respectively, as physical blocks corresponding to the channel Ch7. The controller 60 processes logical blocks of MBAs "18" to "20" to include the pseudo defective block nos. 19 to 21, respectively, as physical blocks corresponding to the channel Ch8.

In this way, in the non-volatile memory 10 of the memory system 100C, the number of defective blocks in each of the logical blocks of MBAs "0" to "20" is one, and the number of defective blocks in each of the logical blocks of MBAs "21" and "22" is zero. That is, the defective blocks are substantially equally distributed into the logical blocks of MBAs "0" to "22", and the logical blocks of MBA "0" to "22" can be accessed through a substantially equal number of channels in parallel. In addition, the number of defective blocks corresponding to each of the channels Ch0, Ch4, and Ch8 is three, and the number of defective blocks corresponding to each of the channels Ch1 to Ch3 and Ch5 to Ch7 is two. That is, the defective blocks are substantially equally distributed to correspond to the plurality of channels Ch0 to Ch8, and the physical blocks accessible in parallel are distributed in a substantially equal number to correspond to the plurality of channels Ch0 to Ch8. As a result, the overall random write performance of the memory system 100C can be stabilized without fluctuation.

Alternatively, the controller 60 of the memory system 100B constructs a plurality of logical blocks with respect to a plurality of physical blocks using 20 initially defective blocks and one pseudo defective block as illustrated in FIG. 7C. The controller 60 generates logical block management information 13 for managing the plurality of logical blocks by assigning logical block addresses MBAs "0" to "22" to a plurality of physical blocks, in such a manner that the 20 initially defective blocks and the one pseudo defective block are distributed into the plurality of logical blocks, and are distributed into the plurality of channels Ch0 to Ch8.

The controller 60 processes logical blocks of MBAs "0" to "2" to include the initially defective block nos. 1 to 3, respectively, as physical blocks corresponding to the channel Ch0. The controller 60 processes a logical block of MBA "3" to include the initially defective block no. 4 as a physical block corresponding to the channel Ch1. The controller 60 processes logical blocks of MBAs "4" to "7" include the initially defective block nos. 5 to 8, respectively, as physical blocks corresponding to the channel Ch2. The controller 60 processes a logical block of MBA "8" to include the pseudo defective block no. 21 as a physical block corresponding to the channel Ch3. The controller 60 processes logical blocks of MBAs "9" to "18" in the same manner. In addition, the controller 60 processes logical blocks of MBAs "19" and "20" to include the initially defective block nos. 19 and 20, respectively, as physical blocks corresponding to the channel Ch7.

In this way, in the non-volatile memory 10 of the memory system 100B, the number of defective blocks in each of the logical blocks of MBAs "0" to "20" is one, and the number of defective blocks in each of the logical blocks of MBAs "21" and "22" is zero. That is, the defective blocks are substantially equally distributed into the logical blocks of MBAs "0" to "22", and the logical blocks of MBA "0" to "22" can be accessed through a substantially equal number of channels in parallel. In addition, the number of defective blocks corresponding to the channel Ch6 is five, the number of defective blocks corresponding to the channel Ch2 is four, the number of defective blocks corresponding to each of the channels Ch0 and Ch5 is three, the number of defective blocks corresponding to each of the channels Ch4 and Ch7 is two, and the number of defective blocks corresponding to each of the channels Ch1 and Ch3 is one. That is, the defective blocks are distributed to correspond to the plurality of channels Ch0 to Ch8 in an allowable range, and the physical blocks accessible in parallel are distributed in an equalized number to correspond to the plurality of channels Ch0 to Ch8 in an allowable range. As a result, the overall random write performance of the memory system 100B can be stabilized without fluctuation.

As illustrated in FIGS. 6C and 7C, the total number of defective blocks is equal between the memory system 100C and the memory system 100B. Thus, a difference in random write performance between the memory system 100C and the memory system 100B is reduced.

The controller 60 in each of the memory systems 100A to 100D stores the generated logical block management information 13 into the non-volatile memory 10 in a non-volatile manner.

As described above, in the present embodiment, each of the plurality of memory systems 100A to 100D constructs a plurality of logical blocks, using a first number of defective blocks and a second number of pseudo defective blocks for shortfall defective blocks with respect to the target number of defective blocks. The plurality of memory systems 100A to 100D generate and stores the construction results as the logical block management information 13. In this way, a plurality of logical blocks can be constructed in such a manner that the total number of defective blocks is equal to the target number of defective blocks in each of the memory systems 100A to 100D, and data can be randomly written to the non-volatile memory 10 managed with the logical block management information 13 based on the construction results. As a result, differences in random write performance between the plurality of memory systems 100A to 100D can be reduced.

It should be noted that, in each of the memory systems 100A to 100D, if valid blocks are changed to pseudo defective blocks in a shortfall number with respect to the target number of defective blocks, an over-provision (OP) rate of each of the memory systems 100A to 100D is reduced. The OP rate is obtained by dividing an overprovisioning capacity for the storage area in each of the memory systems 100A to 100D by a user capacity. The OP rate indicates a rate (over-provision rate) of how much over-provision the storage area secures to allow writing in excess of the user capacity. In each of the memory systems 100A to 100D, if the OP rate is reduced, performance such as random write performance deteriorates. Therefore, it is desirable to suppress the reduction in OP rate.

Figures 8A, 8B:
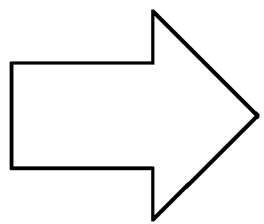
FIGS. 8A and 8B are diagrams illustrating processing for determining a target number of defective blocks in a first modification of the embodiment.

In this regard, as a first modification of the embodiment, an example will be described in which virtual physical blocks are added as pseudo defective blocks. In this case, for management reasons, virtual physical blocks are added on the basis of the number of physical blocks included in each logical block. Thus, the common target number of defective blocks determined in the process of manufacturing the memory systems 100A to 100D (e.g., S3 in FIG. 3) has a range. Specifically, the target number of defective blocks can be determined by adding the number of margins having a range to the largest number of initially defective blocks. The range corresponds to the number of physical blocks included in each logical block. For example, in the case of FIG. 8A, among the numbers of initially defective blocks in the plurality of memory systems 100A to 100D, i.e., 12, 20, 10, and 16, the largest number is 20. Thus, if the number of physical blocks included in each logical block is nine, the target number of defective blocks for each of the memory systems 100A to 100D is determined in a range from "20+1=21" to "20+9=29" as illustrated in FIG. 8B. Note that the virtual physical blocks are not connected to the channels Ch. Therefore, in one logical block including virtual physical blocks, the physical blocks are connected to none of the plurality of channels Ch0 to Ch8.

Figure 9:
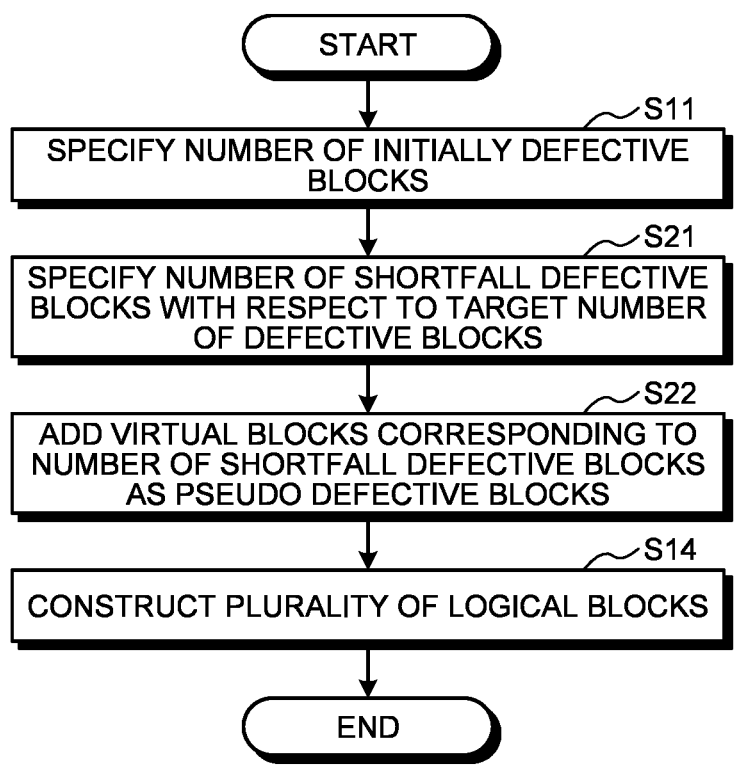
FIG. 9 is a flowchart illustrating processing for constructing logical blocks in the first modification of the embodiment.

In this case, when logical blocks are constructed in each of the memory systems 100A to 100D (e.g., S14 in FIG. 5), processing different from that in the embodiment is performed as illustrated in FIG. 9 in the points to be described below. FIG. 9 is a flowchart illustrating processing for constructing logical blocks in the first modification of the embodiment. Since FIG. 9 includes the same processing as the flowchart illustrated in FIG. 5, different processing will be described below.

In each of the memory systems 100A to 100D, the controller 60 specifies a range for a shortfall number with respect to the target number of defective blocks depending on the number of initially defective blocks specified in S11 (S21). In the case of FIGS. 8A and 8B, the controllers 60 of the memory systems 100A, 100B, 100C, and 100D specify "21−12=9" to "29−12=17", "21−20=1" to "29−20=9", "21−10=11" to "29−10=19", and "21−16=5" to "29−16=13" as the respective numbers of shortfall defective blocks with respect to the target number of defective blocks.

The controller 60 in each of the memory systems 100A to 100D prepares pseudo defective blocks in a number within the range for the number of shortfall defective blocks specified in S21. The controller 60 in each of the memory systems 100A to 100D adds virtual physical blocks in a number within the range for the number of shortfall defective blocks as pseudo defective blocks (S22).

Figures 10A, 10B, 10C:
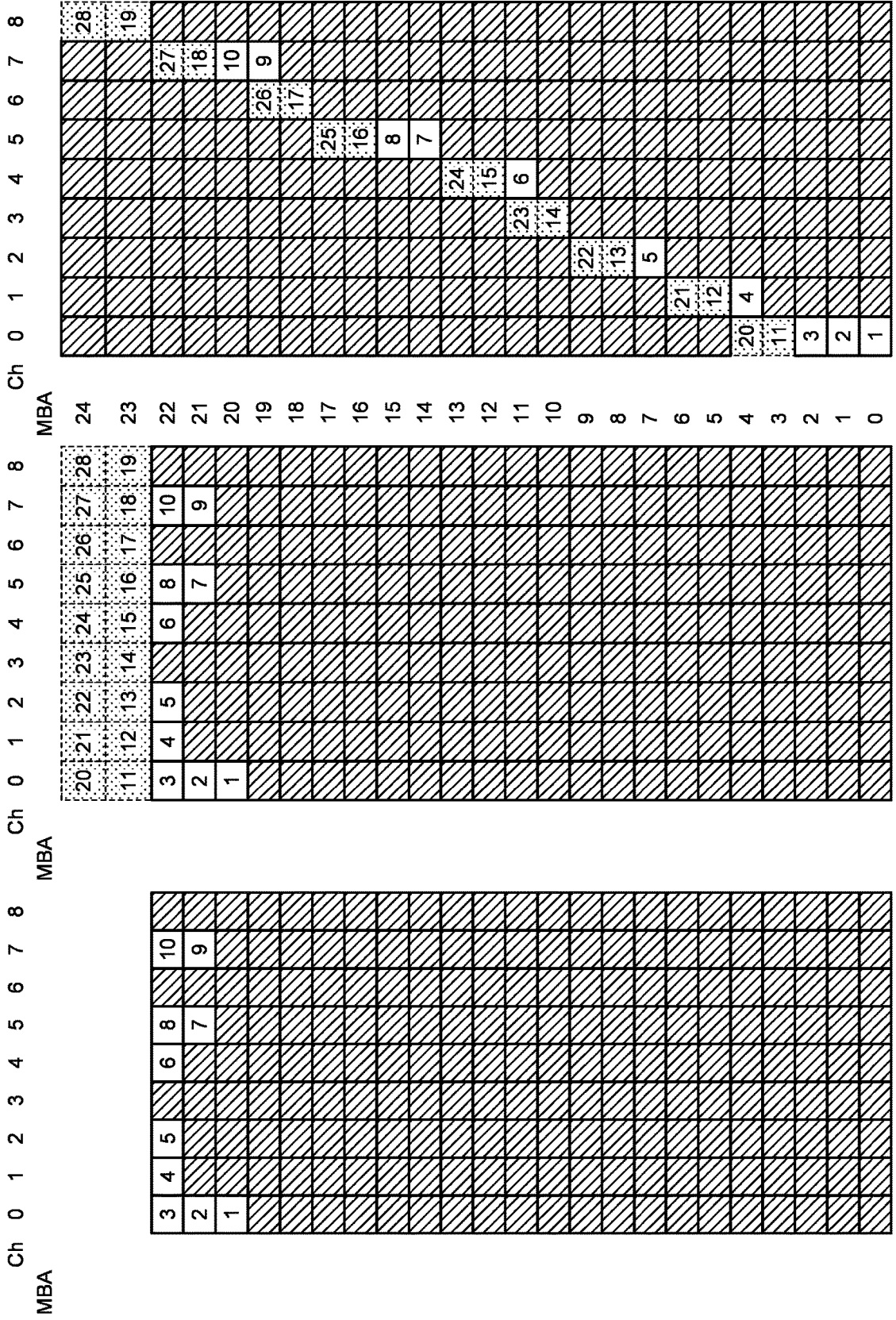

For example, as illustrated in FIGS. 10A and 10B, the controller 60 of the memory system 100C adds 18 virtual physical blocks as pseudo defective blocks because the number of physical blocks constituting two logical blocks, i.e. 9×2=18, falls within the range of "11 to 19" for the number of shortfall defective blocks.

The controller 60 of the memory system 100C may manage the pseudo defective blocks separately by channel. In the case of FIG. 10B, the controller 60 performs management such that pseudo defective block nos. 11 and 20 correspond to the channel Ch0, pseudo defective block nos. 12 and 21 correspond to the channel Ch1, pseudo defective block nos. 13 and 22 correspond to the channel Ch2, pseudo defective block nos. 14 and 23 correspond to the channel Ch3, pseudo defective block nos. 15 and 24 correspond to the channel Ch4, pseudo defective block nos. 16 and 25 correspond to the channel Ch5, pseudo defective block nos. 17 and 26 correspond to the channel Ch6, pseudo defective block nos. 18 and 27 correspond to the channel Ch7, and pseudo defective block nos. 19 and 28 correspond to the channel Ch8. At this time, a logical block address MBA for each physical block is not decided.

Figures 11A, 11B, 11C:
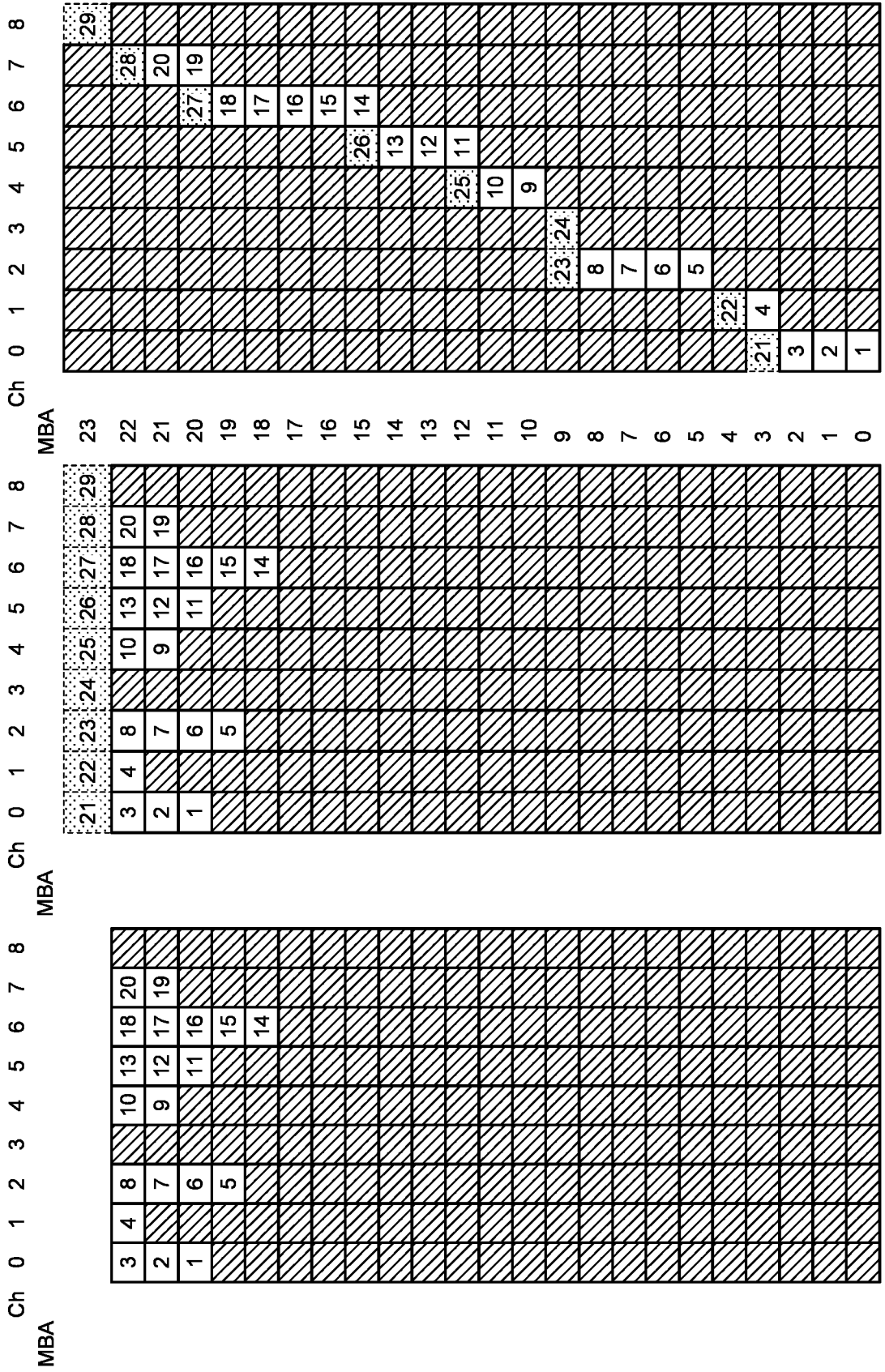
FIGS. 11A to 11C are diagrams illustrating another example of the processing for constructing logical blocks in the first modification of the embodiment.

Alternatively, as illustrated in FIGS. 11A and 11B, the controller 60 of the memory system 100B adds nine virtual physical blocks as pseudo defective blocks because the number of physical blocks constituting one logical block, i.e. nine, falls within the range of "1 to 9" for the number of shortfall defective blocks.

The controller 60 of the memory system 100B may manage the pseudo defective blocks separately by channel. In the case of FIG. 11B, the controller 60 performs management such that pseudo defective block no. 21 corresponds to the channel Ch0, pseudo defective block no. 22 corresponds to the channel Ch1, pseudo defective block no. 23 corresponds to the channel Ch2, pseudo defective block no. 24 corresponds to the channel Ch3, pseudo defective block no. 25 corresponds to the channel Ch4, pseudo defective block no. 26 corresponds to the channel Ch5, pseudo defective block no. 27 corresponds to the channel Ch6, pseudo defective block no. 28 corresponds to the channel Ch7, and pseudo defective block no. 29 corresponds to the channel Ch8. At this time, a logical block address MBA for each physical block is not decided.

As illustrated in FIG. 9, the controller 60 in each of the memory systems 100A to 100D constructs a plurality of logical blocks with respect to a plurality of physical blocks by using the initially defective blocks in the number specified in S11 and the pseudo defective blocks prepared in S22 (S14). Specifically, the controller 60 performs the same processing as S14 of FIG. 5 described in the embodiment.

Note that the first modification of the embodiment is the same as the embodiment in that, as illustrated in FIGS. 10C and 11C, the total number of defective blocks is substantially equal between the memory system 100C and the memory system 100B, thereby reducing a difference in random write performance between the memory system 100C and the memory system 100B.

The controller 60 in each of the memory systems 100A to 100D stores the generated logical block management information 13 into the non-volatile memory 10 in a non-volatile manner.

In this way, by adding virtual physical blocks as pseudo defective blocks, the pseudo defective blocks can be prepared in a shortfall number with respect to the target number of defective blocks without consuming valid blocks. As a result, a reduction in OP rate can be suppressed, thereby reducing differences in random write performance between the plurality of memory systems 100A to 100D.

When the target number of defective blocks is determined within a range as illustrated in FIG. 8B, this allows a difference within the range between the plurality of memory systems 100A to 100D.

Figures 12A, 12B:
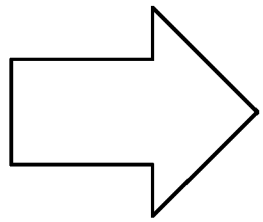
FIGS. 12A and 12B are diagrams illustrating processing for determining a target number of defective blocks in a second modification of the embodiment.

In this regard, as a second modification of the embodiment, an example will be described in which virtual physical blocks are added as pseudo defective blocks, and valid blocks are changed to pseudo defective blocks in a still shortfall number with respect to the target number of defective blocks. In this case, the common target number of defective blocks determined in the process of manufacturing the memory systems 100A to 100D (e.g., S3 in FIG. 3) can be a fixed value. Specifically, the target number of defective blocks can be determined by adding the number of physical blocks included in each logical block to the largest number of initially defective blocks. For example, in the case of FIG. 12A, among the numbers of initially defective blocks in the plurality of memory systems 100A to 100D, i.e., 12, 20, 10, and 16, the largest number is 20. Thus, if the number of physical blocks included in each logical block is nine, the target number of defective blocks for each of the memory systems 100A to 100D is determined as 20+9=29 as illustrated in FIG. 12B.

Figure 13:
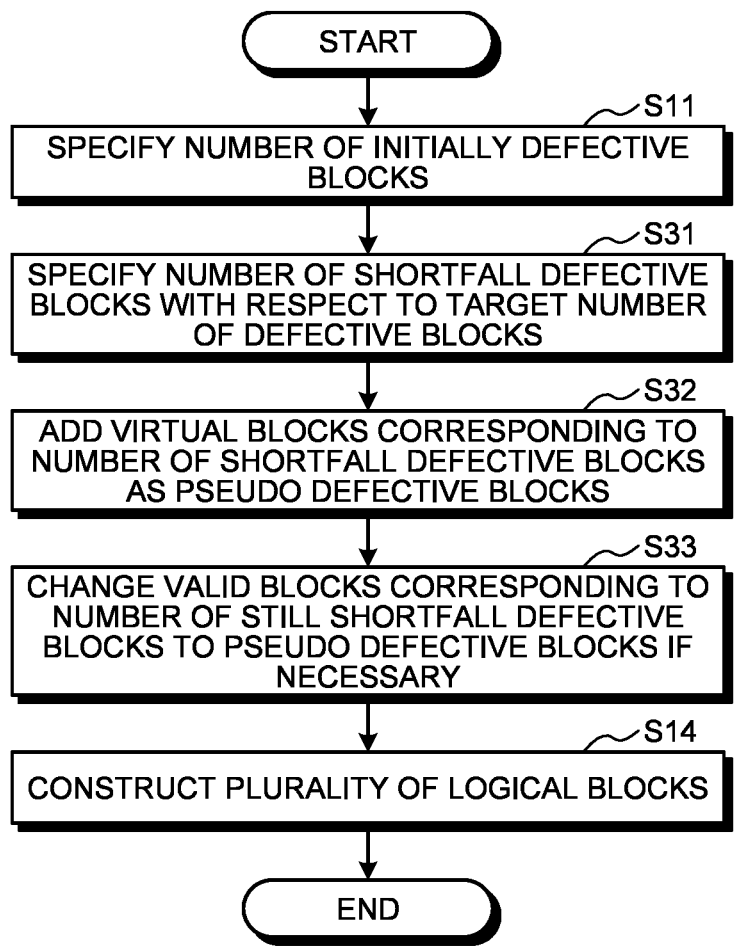
FIG. 13 is a flowchart illustrating processing for constructing logical blocks in the second modification of the embodiment.

In this case, when logical blocks are constructed in each of the memory systems 100A to 100D (e.g., S14 in FIG. 5), processing different from that in the embodiment is performed as illustrated in FIG. 13 in the points to be described below. FIG. 13 is a flowchart illustrating processing for constructing logical blocks in the second modification of the embodiment. Since FIG. 13 includes the same processing as the flowchart illustrated in FIG. 5, different processing will be described below.

In each of the memory systems 100A to 100D, the controller 60 specifies the number of shortfall defective blocks with respect to the target number of defective blocks depending on the number of initially defective blocks specified in S11 (S31). In the case of FIGS. 12A and 12B, the controllers 60 of the memory systems 100A, 100B, 100C, and 100D specify 29−12=17, 29−20=9, 29−10=19, and 29−16=13 as the respective numbers of shortfall defective blocks with respect to the target number of defective blocks.

The controller 60 in each of the memory systems 100A to 100D prepares pseudo defective blocks in a number corresponding to the number of shortfall defective blocks specified in S31. The controller 60 in each of the memory systems 100A to 100D adds virtual physical blocks in a number corresponding to the number of shortfall defective blocks as pseudo defective blocks (S32). The controller 60 may add virtual physical blocks in a number closest to the number of shortfall defective blocks while not exceeding the number of shortfall defective blocks as pseudo defective blocks.

Figures 14A, 14B, 14C:
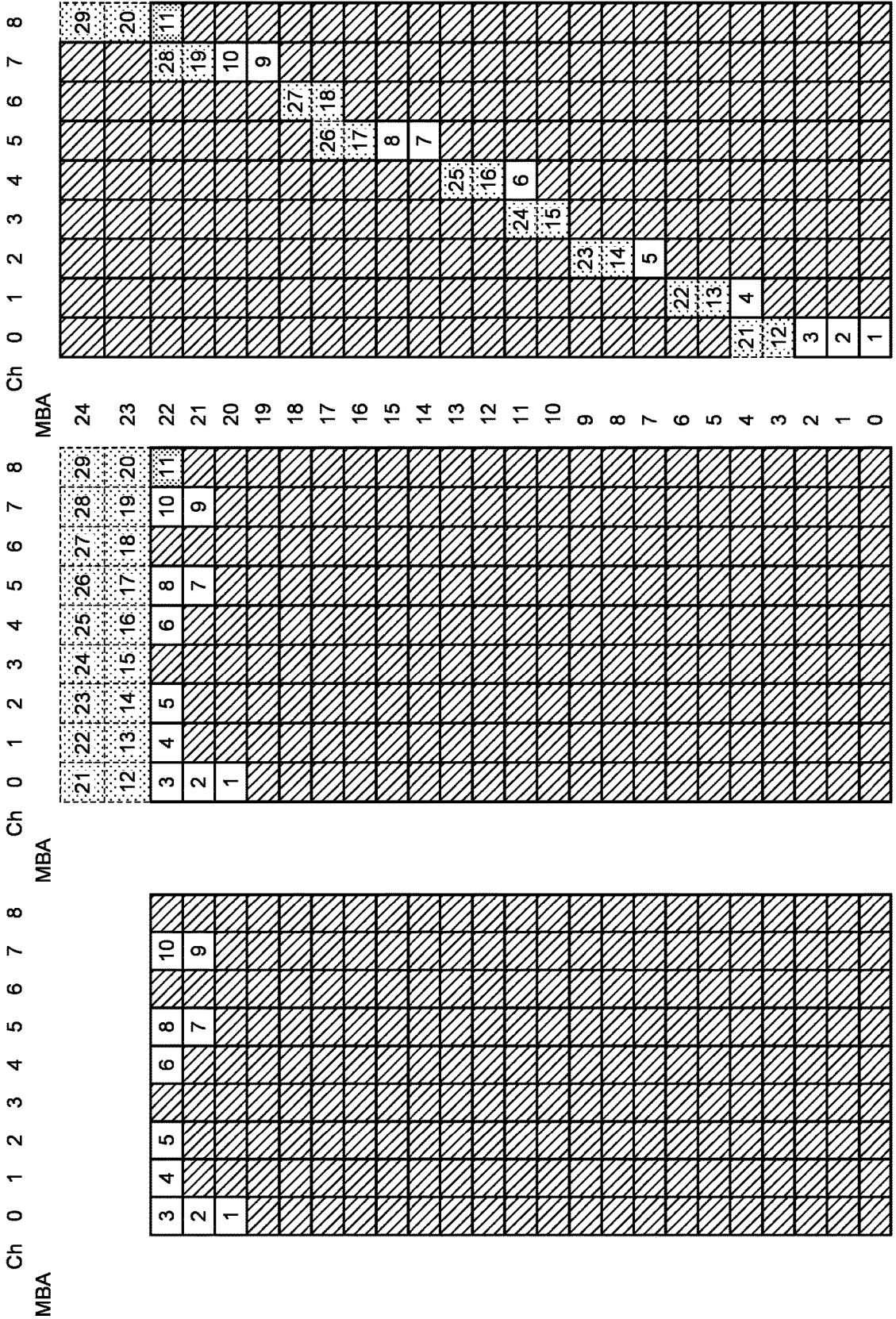
FIGS. 14A to 14C are diagrams illustrating an example of the processing for constructing logical blocks in the second modification of the embodiment.

For example, as illustrated in FIGS. 14A and 14B, the controller 60 of the memory system 100C adds 18 virtual physical blocks as pseudo defective blocks because the number of physical blocks constituting two logical blocks, i.e. 9×2=18, is closest to the number of shortfall defective blocks, i.e. "19", while not exceeding the number of shortfall defective blocks, i.e. "19".

Alternatively, as illustrated in FIGS. 15A and 15B, the controller 60 of the memory system 100D adds nine virtual physical blocks as pseudo defective blocks because the number of physical blocks constituting one logical block, i.e. 9, is closest to the number of shortfall defective blocks, i.e. "13", while not exceeding the number of shortfall defective blocks, i.e. "13".

Alternatively, as illustrated in FIGS. 11A and 11B, the controller 60 of the memory system 100B adds nine virtual physical blocks as pseudo defective blocks because the number of physical blocks constituting one logical block, i.e. 9, is closest to the number of shortfall defective blocks, i.e. "9", while not exceeding the number of shortfall defective blocks, i.e. "9".

As illustrated in FIG. 13, the controller 60 in each of the memory systems 100A to 100D prepares additional pseudo defective blocks corresponding to the number of still shortfall defective blocks, if necessary, even though pseudo defective blocks have been added in S32 with respect to the number of shortfall defective blocks specified in S31. The controller 60 in each of the memory systems 100A to 100D changes valid blocks corresponding to the number of still shortfall defective blocks to pseudo defective blocks, respectively, if necessary (S33). The controller 60 determines whether or not there will be still shortfall defective blocks after the addition in S32 with respect to the number of shortfall defective blocks specified in S31. If so, the controller 60 changes valid blocks corresponding to the number of still shortfall defective blocks to pseudo defective blocks, respectively.

For example, as illustrated in FIG. 14B, the controller 60 of the memory system 100C changes one valid block to a pseudo defective block, because 18 virtual physical blocks are added with one shortfall defective block (19−18=1). The controller 60 preferentially changes a valid block corresponding to the channels Ch3, Ch6, and Ch8, each having a relatively small number of initially defective blocks, to a pseudo defective block. In the case of FIG. 14B, the controller 60 changes one valid block corresponding to the channel Ch8 to one pseudo defective block.

Alternatively, as illustrated in FIG. 15B, the controller 60 of the memory system 100D changes four valid blocks to pseudo defective blocks, because nine virtual physical blocks are added with four shortfall defective blocks (13−9=4). The controller 60 preferentially changes valid blocks corresponding to the channels Ch3 and Ch8, each having no initially defective block, to pseudo defective blocks. In the case of FIG. 15B, the controller 60 changes two valid blocks corresponding to the channel Ch3 to two pseudo defective blocks, and changes two valid blocks corresponding to the channel Ch8 to two pseudo defective blocks.

Alternatively, as illustrated in FIG. 11B, the controller 60 of the memory system 100B does not change a valid block to a pseudo defective block, because nine virtual physical blocks are added with zero shortfall defective block (9−9=0), that is, there is no shortfall.

As illustrated in FIG. 13, the controller 60 in each of the memory systems 100A to 100D constructs a plurality of logical blocks with respect to a plurality of physical blocks by using the initially defective blocks in the number specified in S11 and the pseudo defective blocks prepared in S32 and S33 (S14). Specifically, the controller 60 performs the same processing as S14 of FIG. 5 described in the embodiment.

Note that the second modification of the embodiment is the same as the embodiment in that, as illustrated in FIGS. 14C, 15C, and 11C, the total number of defective blocks is equal between the memory system 100C, the memory system 100D, and the memory system 100B, thereby reducing a difference in random write performance between the memory system 100C, the memory system 100D, and the memory system 100B.

The controller 60 in each of the memory systems 100A to 100D stores the generated logical block management information 13 into the non-volatile memory 10 in a non-volatile manner.

In this way, by adding virtual physical blocks as pseudo defective blocks and changing valid blocks to pseudo defective blocks in a still shortfall number with respect to the target number of defective blocks if necessary, the pseudo defective blocks can be prepared in the shortfall number with respect to the target number of defective blocks while suppressing the consumption of valid blocks. As a result, a reduction in OP rate can be suppressed, thereby reducing differences in random write performance between the plurality of memory systems 100A to 100D.

The second modification exemplifies processing for preparing pseudo defective blocks by combining the addition of virtual physical blocks and the change from valid blocks while the addition of the virtual physical block is preferentially applied.

On the other hand, as a third modification of the embodiment, an example will be described in which pseudo defective blocks are prepared by combining the addition of virtual physical blocks and the change from valid blocks while the change from the valid blocks is preferentially applied. In this case, the common target number of defective blocks determined in the process of manufacturing the memory systems 100A to 100D (e.g., S3 in FIG. 3) can be a fixed value. Specifically, the target number of defective blocks can be determined by adding the number of margins (e.g., one) to the largest number of initially defective blocks in the same manner as in the embodiment. For example, as illustrated in FIG. 4B, 20+1=21 is determined as the target number of defective blocks for each of the memory systems 100A to 100D.

Figure 16:
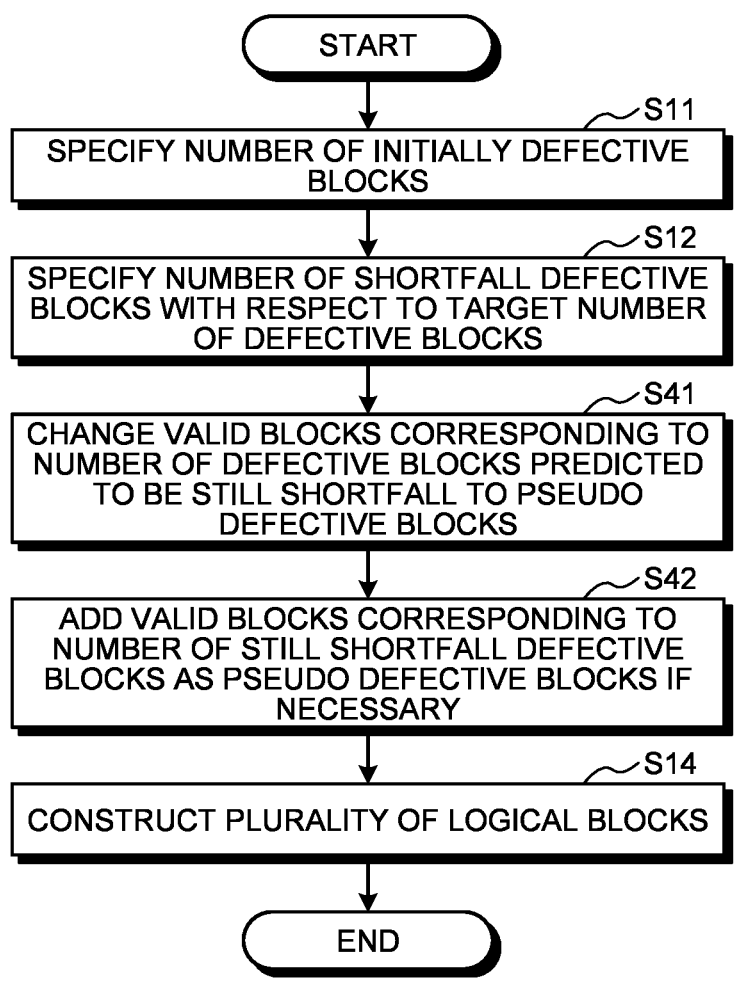
FIG. 16 is a flowchart illustrating processing for constructing logical blocks in a third modification of the embodiment.

In this case, when logical blocks are constructed in each of the memory systems 100A to 100D (e.g., S14 in FIG. 5), processing different from that in the embodiment is performed as illustrated in FIG. 16 in the points to be described below. FIG. 16 is a flowchart illustrating processing for constructing logical blocks in the third modification of the embodiment. Since FIG. 16 includes the same processing as the flowchart illustrated in FIG. 5, different processing will be described below.

In each of the memory systems 100A to 100D, the controller 60 specifies the number of shortfall defective blocks with respect to the target number of defective blocks depending on the number of initially defective blocks specified in S11 (S12). In the case of FIGS. 4A and 4B, the controllers 60 of the memory systems 100A, 100B, 100C, and 100D specify 21−12=9, 21−20=1, 21−10=11, and 21−16=5 as the respective numbers of shortfall defective blocks with respect to the target number of defective blocks.

The controller 60 in each of the memory systems 100A to 100D prepares pseudo defective blocks corresponding to the number of defective blocks predicted to be still shortfall in S42, which will be described later, with respect to the number of shortfall defective blocks specified in S12. The controller 60 in each of the memory systems 100A to 100D changes valid blocks corresponding to the number of defective blocks predicted to be still shortfall in S42, which will be described later, to pseudo defective blocks with respect to the number of shortfall defective blocks specified in S12 (S41). The controller 60 predicts the number of defective blocks to be added in S42, which will be described later, according to the number of shortfall defective blocks specified in S12. The controller 60 predicts the number of still shortfall defective blocks in S42 according to the predicted number of defective blocks to be added. The controller 60 may change valid blocks corresponding to the predicted number of shortfall defective blocks to pseudo defective blocks, respectively.

Figures 17A, 17B, 17C:
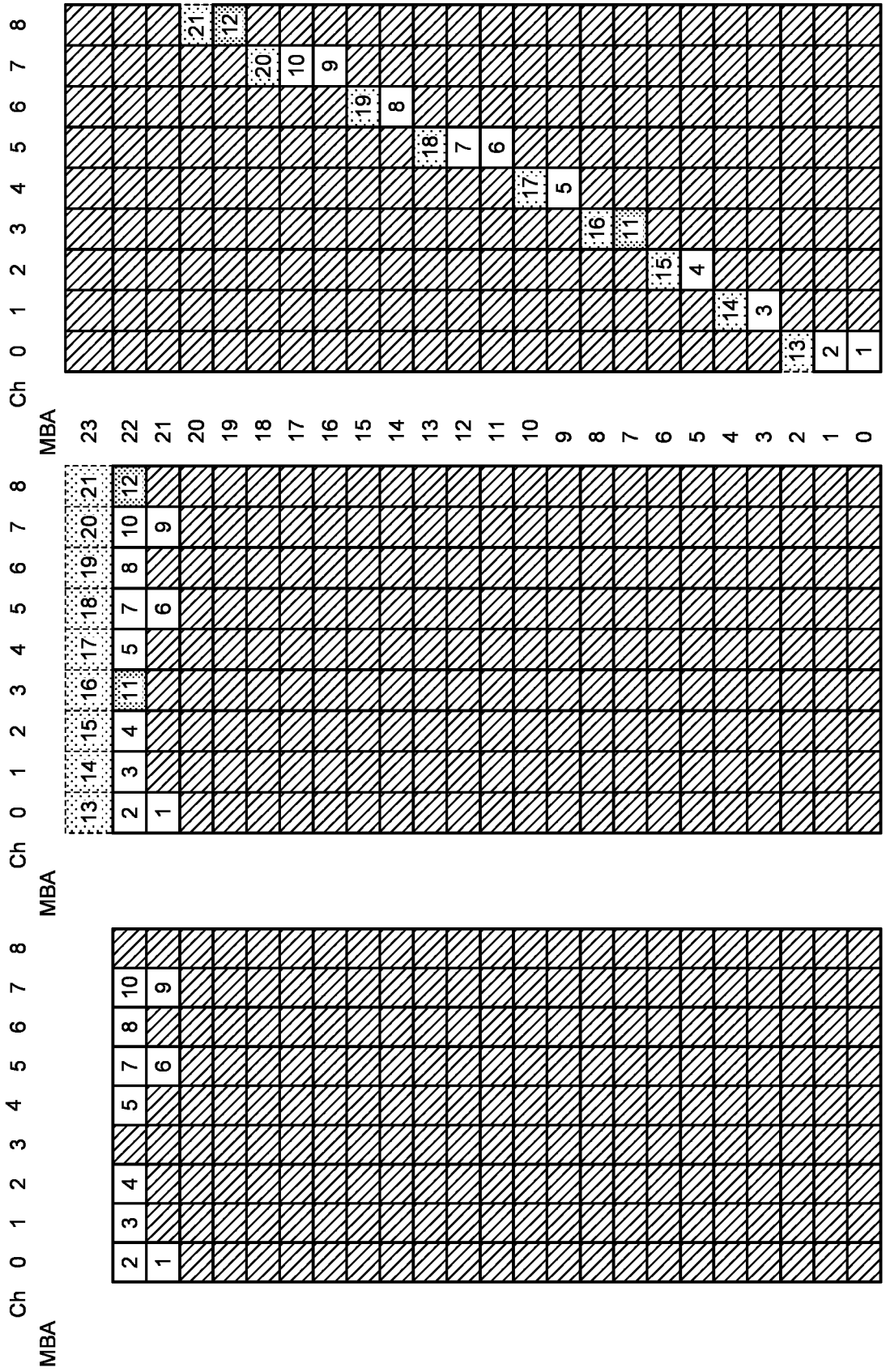
FIGS. 17A to 17C are diagrams illustrating the processing for constructing logical blocks in the third modification of the embodiment.

For example, the controller 60 of the memory system 100C predicts that virtual physical blocks constituting one logical block will be added in S42, because the number of shortfall defective blocks with respect to the target number of defective blocks is 11, and the number of logical block-based physical blocks closest to 11 while not exceeding one is nine. That is, the controller 60 predicts that nine virtual physical blocks will be added in S42, as illustrated in FIGS. 17A and 17B. According to the predicted number of virtual physical blocks to be added, i.e. nine, the controller 60 predicts that two defective blocks (11−9=2) will be a shortfall in S42. As illustrated in FIG. 17B, the controller 60 changes two valid blocks corresponding to the predicted number of shortfall defective blocks to pseudo defective blocks. The controller 60 preferentially changes valid blocks corresponding to the channels Ch3 and Ch8, each having a relatively small number of initially defective blocks, to pseudo defective blocks. In the case of FIG. 17B, the controller 60 changes one valid block corresponding to the channel Ch3 to one pseudo defective block, and changes one valid block corresponding to the channel Ch8 to one pseudo defective block.

Alternatively, the controller 60 of the memory system 100B predicts that virtual physical blocks constituting one logical block will not be added in S42, because the number of shortfall defective blocks with respect to the target number of defective blocks is one, which is smaller than the number of physical block constituting one logical block. That is, the controller 60 predicts that no virtual physical block will be added in S42, as illustrated in FIGS. 7A and 7B. According to the predicted number of virtual physical blocks to be added, i.e. zero, the controller 60 predicts that one defective block (1−0=1) will be a shortfall in S42. As illustrated in FIG. 7B, the controller 60 changes one valid block corresponding to the predicted number of shortfall defective blocks to a pseudo defective block. The controller 60 preferentially changes valid blocks corresponding to the channels Ch3 and Ch8, each having a relatively small number of initially defective blocks, to pseudo defective blocks. In the case of FIG. 7B, the controller 60 changes one valid block corresponding to the channel Ch3 to one pseudo defective block.

As illustrated in FIG. 16, the controller 60 in each of the memory systems 100A to 100D prepares, if necessary, additional pseudo defective blocks corresponding to the number of still shortfall defective blocks after the change in S41 with respect to the number of shortfall defective blocks specified in S12. The controller 60 in each of the memory systems 100A to 100D adds, if necessary, virtual physical blocks corresponding to the number of still shortfall defective blocks after the change in S41 as pseudo defective blocks, respectively (S42). The controller 60 determines whether or not there will be still shortfall defective blocks after the change in S41 with respect to the number of shortfall defective blocks specified in S12. If so, the controller 60 add virtual physical blocks corresponding to the number of still shortfall defective blocks as pseudo defective blocks, respectively.

For example, as illustrated in FIG. 17B, the controller 60 of the memory system 100C adds nine virtual physical blocks, which constitute one logical block, as nine pseudo defective blocks, because of the change from two valid blocks with nine shortfall defective blocks (11−2=9).

Alternatively, the controller 60 of the memory system 100B adds no virtual physical block because of the change from one valid block with no shortfall defective block (1−1=0), that is, there is no shortfall.

As illustrated in FIG. 16, the controller 60 in each of the memory systems 100A to 100D constructs a plurality of logical blocks with respect to a plurality of physical blocks by using the initially defective blocks in the number specified in S11 and the pseudo defective blocks prepared in S41 and S42 (S14). Specifically, the controller 60 performs the same processing as S14 of FIG. 5 described in the embodiment.

Note that the third modification of the embodiment is the same as the embodiment in that, as illustrated in FIGS. 17C and 7C, the total number of defective blocks is equal between the memory system 100C and the memory system 100B, thereby reducing a difference in random write performance between the memory system 100C and the memory system 100B.

The controller 60 in each of the memory systems 100A to 100D stores the generated logical block management information 13 into the non-volatile memory 10 in a non-volatile manner.

In this way, by predicting the number of shortfall defective blocks with respect to the target number of defective blocks when virtual physical blocks are added, changing valid blocks to pseudo defective blocks in the predicted number, and adding virtual physical blocks as pseudo defective blocks if necessary, the pseudo defective blocks can be prepared in the shortfall number with respect to the target number of defective blocks while suppressing the consumption of valid blocks. As a result, a reduction in OP rate can be suppressed, thereby reducing differences in random write performance between the plurality of memory systems 100A to 100D.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory including a plurality of physical blocks; and
   a controller connected to any of the plurality of physical blocks via a plurality of channels, and configured to construct a plurality of logical blocks and to read or write data from or into any of the plurality of logical blocks constructed,
   wherein the logical blocks are management units in which any of the physical blocks is grouped across the plurality of channels, and
   the controller is configured to construct the plurality of logical blocks so that a first number of defective blocks and a second number of pseudo defective blocks for shortfall defective blocks with respect to a target number of defective blocks are distributed into the plurality of logical blocks.

2. The memory system according to claim 1, wherein with respect to each of the constructed plurality of logical blocks, the number of physical blocks to be parallelly accessible is substantially equal to each other.

3. The memory system according to claim 1, wherein the pseudo defective blocks include valid blocks other than the defective blocks among the plurality of physical blocks.

4. The memory system according to claim 1, wherein the pseudo defective blocks include virtual physical blocks for the plurality of physical blocks, and the virtual physical blocks are not connected to any of the plurality of channels.

5. The memory system according to claim 1, wherein the second number of pseudo defective blocks includes a third number of virtual physical blocks for the plurality of physical blocks and a fourth number of valid blocks among the plurality of physical blocks, and the second number is a value obtained by adding the third number and the fourth number.

6. The memory system according to claim 1, wherein the second number of pseudo defective blocks includes virtual physical blocks in the second number for the plurality of physical blocks, without including valid blocks.

7. The memory system according to claim 1, wherein the second number of pseudo defective blocks includes valid blocks in the second number among the plurality of physical blocks, without including virtual physical blocks for the plurality of physical blocks.

8. The memory system according to claim 1, wherein the controller is configured to construct the plurality of logical blocks so that the first number of defective blocks and the second number of pseudo defective blocks are distributed into the plurality of logical blocks and distributed into the plurality of channels.

9. The memory system according to claim 8, wherein with respect to each of the plurality of channels, the number of physical blocks to be parallelly accessible is substantially equal to each other.

10. The memory system according to claim 8, wherein the pseudo defective blocks include valid blocks other than the defective blocks among the plurality of physical blocks, the valid blocks corresponding to a channel having a smallest number of defective blocks among the plurality of channels.

11. The memory system according to claim 1, wherein the target number of defective blocks is determined to be shared in common by a plurality of memory systems including the memory system, based on the respective numbers of initially defective blocks of the plurality of memory systems.

12. The memory system according to claim 11, wherein the target number of defective blocks is determined by adding a specific number to a largest one of the numbers of initially defective blocks in the plurality of memory systems.

13. The memory system according to claim 11, wherein the target number of defective blocks is determined within a range from a number obtained by adding to an upper limit of the number of physical blocks constituting one logical block to a largest one of the numbers of initially defective blocks in the plurality of memory systems to a number obtained by adding to a lower limit of the number of physical blocks constituting one logical block to the largest number of initially defective blocks.

14. The memory system according to claim 11, wherein the target number of defective blocks is determined by adding a maximum number of physical blocks constituting one logical block to a largest one of the numbers of initially defective blocks in the plurality of memory systems.

15. A control method of a memory system in which any of a plurality of physical blocks in a non-volatile memory is connected to a plurality of channels, the control method comprising:

constructing a plurality of logical blocks; and
reading or writing data from or into any of the plurality of logical blocks constructed,
wherein the logical blocks are management units in which any of the physical blocks is grouped across the plurality of channels, and
the constructing includes:
specifying a first number of defective blocks among the plurality of physical blocks;
specifying a second number of shortfall defective blocks with respect to a target number of defective blocks depending on the first number;
preparing second number of pseudo defective blocks; and
constructing the plurality of logical blocks so that the first number of defective blocks and the second number of pseudo defective blocks are distributed into the plurality of logical blocks.

16. The control method according to claim 15, wherein the pseudo defective blocks include valid blocks other than the defective blocks among the plurality of physical blocks.

17. The control method according to claim 15, wherein the pseudo defective blocks include virtual physical blocks for the plurality of physical blocks, and the virtual physical blocks are not connected to any of the plurality of channels.

18. The control method according to claim 15, wherein the second number of pseudo defective blocks includes a third number of virtual physical blocks for the plurality of physical blocks and a fourth number of valid blocks among the plurality of physical blocks, and the second number is a value obtained by adding the third number and the fourth number.

19. The control method according to claim 15, wherein the constructing of the plurality of logical blocks includes constructing the plurality of logical blocks so that the first number of defective blocks and the second number of pseudo defective blocks are distributed into the plurality of logical blocks and distributed into the plurality of channels.

20. The control method according to claim 15, wherein the target number of defective blocks is determined to be shared in common by a plurality of memory systems including the memory system, based on the respective numbers of initially defective blocks of the plurality of memory systems.

* * * * *